March 9, 1965 E. V. PAHOLEK ET AL 3,172,719

PRINTED CIRCUIT BOARD CONNECTOR

Filed July 31, 1962 4 Sheets-Sheet 1

INVENTORS: E. V. PAHOLEK
N. WASSERMAN

BY John C. Morris

ATTORNEY

March 9, 1965 E. V. PAHOLEK ET AL 3,172,719

PRINTED CIRCUIT BOARD CONNECTOR

Filed July 31, 1962 4 Sheets-Sheet 2

INVENTORS: E.V. PAHOLEK
N. WASSERMAN

BY John C. Morris

ATTORNEY

March 9, 1965 E. V. PAHOLEK ETAL 3,172,719

PRINTED CIRCUIT BOARD CONNECTOR

Filed July 31, 1962 4 Sheets-Sheet 3

INVENTORS: E.V. PAHOLEK
N. WASSERMAN

BY John C. Morris

ATTORNEY

INVENTORS E.V. PAHOLEK
N. WASSERMAN
BY John C. Morris
ATTORNEY

United States Patent Office 3,172,719
Patented Mar. 9, 1965

3,172,719
PRINTED CIRCUIT BOARD CONNECTOR

Edward V. Paholek, Brooklyn, and Norman Wasserman, Bayside, N.Y., assignors to Bell Telephone Laboratories, Incorporated, New York, N.Y., a corporation of New York Filed July 31, 1962, Ser. No. 213,642
2 Claims. (Cl. 339—186)

This invention relates to electrical devices for making connections with printed circuit boards and more specifically to electrical devices having terminals that are pre-tensioned in and of themselves.

When making electrical connections between terminals in a connector and their mating structure, sufficient contact force must be supplied to the terminal to insure electrical continuity. Since the majority of connectors employ terminals with a spring contact, the contact force is proportional to the deflection of the spring contact. Sufficient contact force necessitates either a large deflection of the spring contact or pre-tensioning of the spring contact, the latter being most desirable but old in the art. Most connectors comprise an insulating block, having electrical terminals contained within the block in an appropriate geometric pattern. The terminals include a contactor member, the latter most generally being pre-tensioned against a rib or other suitable restraining means that is part of the connector block. The pre-tensioning is obtained when the terminal is inserted in the connector block. The contactor member is biased by the rib or restraining means of the connector block in such manner as to pre-tension the contactor member in a desired direction. The terminal in its free position, that is, when it is not inserted in the connector block, is not pre-tensioned because of the lack of the interaction between the terminal contactor member and the rib or restraining means of the connector block. Back up springs, cams and the like are other devices incorporated in other electrical connectors to obtain adequate pre-tensioning of the terminal contactor member.

The pre-tensioning obtained in the above-mentioned devices is derived by the interaction of the contactor member of the terminal working in conjunction with structures other than that of the terminal. Since the amount of pre-tensioning of the terminal contactor member is critical in some applications, it is desirable to be able to measure the amount of pre-tensioning of the terminals.

Because the above-described terminals derive this pre-tensioning from the interaction of the terminal contactor member with an appropriate structure of a connector block, the amount of pre-tensioning can not be measured without inserting the terminals in a connector block, special measuring jig or fixture. If an adjustment as to the amount of pre-tensioning is necessary, the terminal must be extracted from the connector block, jig or fixture, adjusted, and then reinserted back into the block, jig or fixture for further measurement and verification. In some instances, the insulation block may vary in critical dimensions and terminals which have been measured and adjusted for the proper amount of pre-tensioning in a special jig or fixture may change in the amount of pre-tensioning when placed in an insulating block. Also, terminals dependent on pre-tensioning derived from the interaction of the terminal contactor member with structure other than its own, are subject to variances in critical dimensions of the structure with which it interacts and the amount of pre-tensioning of a multiplicity of terminals may vary with every terminal in the insulating block.

Another desirable feature of electrical devices of this nature is to be able to key or polarize the connector. Although this feature is incorporated in some of the prior art, most polarized connectors are made so by either blocking or inserting a plug of some kind in one of the terminal openings, or shaping the block and board in such a manner that only one insertion possibility of a printed circuit board exists. The first method mentioned is costly in that each connector polarized involves the loss of one terminal and its accompanying circuit. In order to make up for the loss, additional circuits, connectors and space may be required. The second method involves special boards for special connector blocks and destroys the interchangeability or versatility of the system.

An object of the invention is to provide a polarized printed circuit board connector wherein the pre-tensioning of the terminal contactor members can be measured and adjusted before the terminals are inserted in the connector block and where the connector can be polarized without the subsequent loss of any of the connector terminals.

A feature of the invention resides in an electrical connector wherein the terminals of the connector are pre-tensioned in and of themselves.

Another feature of the invention lies in an electrical printed circuit board connector wherein the insulating block is shaped to receive a key or polarizer in such a manner that none of the connector terminals are incapacitated for electrical usage.

A preferred embodiment of the invention comprises an insulating block having a plurality of self-pre-tensioned terminals. The terminals are formed out of resilient sheets of electrically conducting material which are bent back upon themselves near a center portion to form two arms. The second arm is bifurcated from adjacent the first arm to the end of the second arm, thereby forming two contactor members. Bifurcation of the second arm is deemed essential to insure electrical contact between the board and the connector. If dirt or some other foreign insulating material should by chance prevent electrical continuity between one contactor member and the electrical circuit on the printed circuit board, the other contactor member provides an alternate electrical path, thereby insuring electrical contact between the printed circuit board and the connector terminal. To further insure electrical contact, each contactor member includes a precious-metal contact portion.

On the end of the first arm of the terminal are located two lugs and an embossed portion. The embossed portion cooperates with the insulation block to properly hold the terminals within the block in predetermined positions. Those familiar with the connector art will recognize that the function of the embossed portion is to secure the terminal in the connector block. Other equivalent deforming means such as tabbing and punching are within the scope of this disclosure. The two lugs are formed to cooperate with the ends of the two contactor members. The lugs restrict the motion of the two members in a direction away from the first arm, thereby creating a pre-tensioning of the contactor members.

The insulation block of the connector has an elongated rectangular cavity in its front surface to receive a printed circuit board. The terminals are located along the elongated side walls of the block, each having an extended element that protrudes through the rear surface of the block to communicate with an electrical conductor. Each terminal is separated from the next terminal by a rib or protrusion from the side wall. The outside surfaces of the elongated side walls contain paired grooves; each groove being paired with another on the opposite side wall. The grooves run in the same line as the separating ribs, that is, parallel to a longitudinal axial line of the terminals, but are located in-between the terminals in like manner as the separating ribs.

In at least one of the above-mentioned groove pairs, a polarizing key is located. The key is U-shaped so that each arm of the U fits into an appropriate groove on the side walls of the connector block while the connecting element of the U fits over the front face of the connector block. The printed circuit board is slotted between the printed circuits so that when it is inserted into the connector block, the polarizing key fits up into the slot. Since the grooves and the printed circuit board slot are located in-between the terminals and the printed circuitry, the polarizing key accomplishes its function without loss of an electrical terminal or circuit. The polarizing key can be insulated to prevent short circuiting the adjacent printed circuits on the board.

The invention will be more clearly understood from the following detailed description, when read in conjunction with the drawing, in which.

According to the invention, as depicted by the various figures, the connector comprises an insulating block 10, a polarizing key 11, and a multiplicity of electrical terminals 12.

Figure 1:
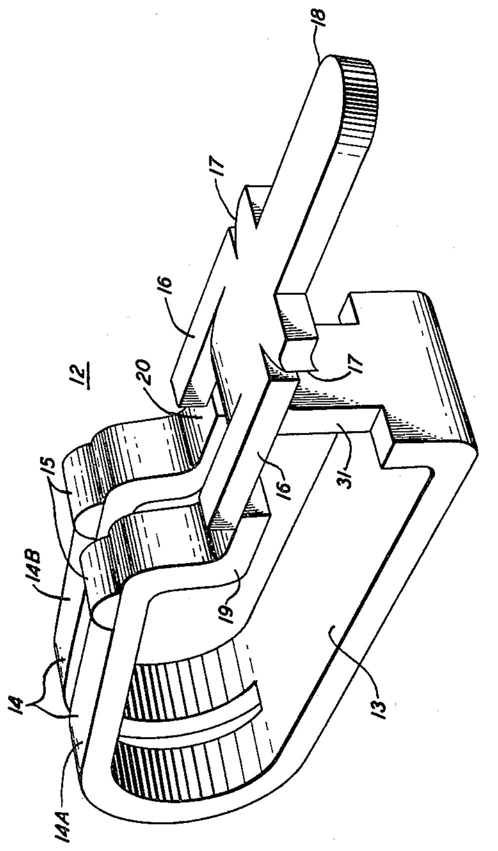
FIG. 1 is an isometric view of the terminal.
Figure 2:
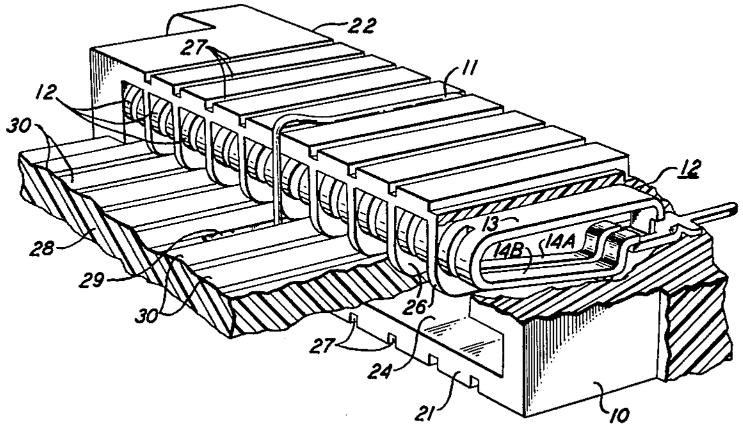
FIG. 2 is a sectioned isometric view of a connector showing the terminals, printed circuit board and polarizing key.

As shown in FIG. 1, the electrical terminals 12 are formed from a flat sheet of resilient electrically conducting material bent back upon itself to form two arms 13 and 14. The second arm 14 is bifurcated from near the arm 13 to the end of arm 14, thereby defining two contactor members 14A and 14B. The contactor members 14A and 14B further include precious metal contact portions 15.

The end of the arm 13 is bent at an angle of 90 degrees to itself toward contactor members 14A and 14B forming a push surface 31 which will be explained at a more distant point in the specification. Near the end of the arm 13 are two lugs 16, an embossed portion 17, and an extended element 18. The free ends 19 and 20 of the members 14A and 14B are also bent back towards arm 13 so that the lugs 16 operatively contact the free ends 19 and 20, restricting their movement in a direction away from arm 13. The restricting of the ends 19 and 20 by the lugs 16 pre-tensions the contactor members 14A and 14B. The terminal is therefore pre-tensioned against itself and the amount of pre-tensioning can be measured and adjusted while the terminal 12 is outside of the connector block 10.

The pre-tensioning is determined during the manufacturing process by fixing the relative positions of the lugs 16 with respect to the ends 19 and 20 of the contactor members 14A and 14B. If properly made, a terminal 12 will not require adjustment of the pre-tensioning but it is obvious that if such adjustment is required, bending of the lugs 16 either up or down will increase or decrease the amount of pre-tensioning as desired. This process of adjustment can be carried out before the terminal 12 is inserted into a connector block 10. Subsequent insertion of the terminal 12 into the insulating block 10 does not affect the amount of pre-tensioning because the pre-tensioning is in no way a function of the dimensions of the connector block 10 nor any other structure other than its own.

The connector block 10 includes a front surface 21 and a rear surface 22. In the front surface 21 is located an elongated rectangular opening leading into an interior cavity 24. The interior cavity 24 has a floor surface 23 with rectangular holes 25 that communicate through the floor surface 23 to the rear surface 22. Along at least one side wall is located a plurality of terminals 12 separated on the inside of the side wall by a series of ribs or projections 26. Running in line and parallel with the ribs 26 but on the outside of the side walls are a series of grooves 27. The grooves 27 are located in-between the terminals 12 so that when a polarizing key 11 is used in conjunction with the block 10, it will not block access to a terminal 12.

Figure 3:
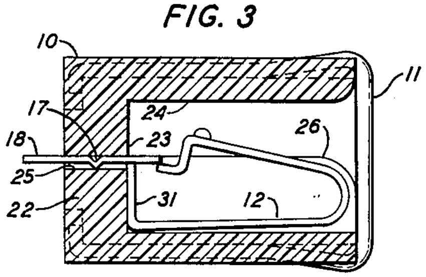
FIG. 3 is a section view of FIG. 2 taken through an electrical terminal and shows the polarizing key.
Figure 4:
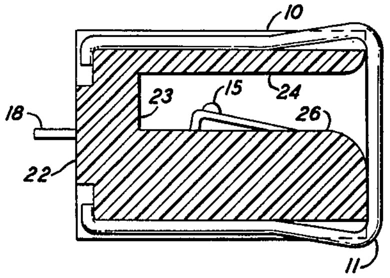
FIG. 4 is a section view of FIG. 2 taken through a terminal separating rib and shows the polarizing key.
Figure 5:
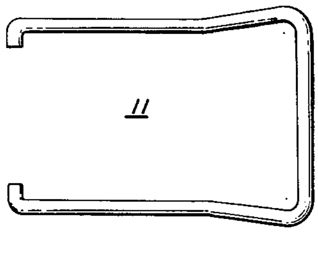
FIG. 5 is a plan view of the polarizing key.
Figure 6:
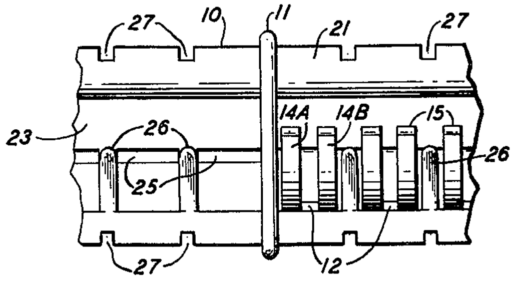
FIG. 6 is a face view of FIG. 2 showing the respective positions of the connector block, terminals and polarizing key when no printed circuit board is inserted in the connector.
Figure 8:
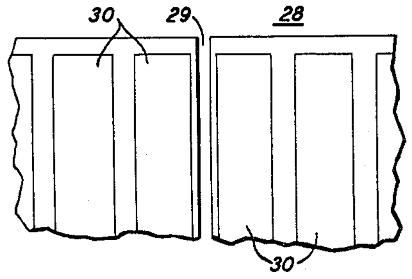
FIG. 8 is a portion of a plan view of the printed circuit board showing the printed circuitry and the polarizing slot.

The assembly of the connecter can best be discussed with reference to FIGS. 3, 4 and 6. The terminals 12, after having been adjusted for the proper amount of pre-tensioning, are inserted into the connector block 10. The terminals 12 fit between the separating projections 26 so that each terminal 12 is separated by a rib 26 from its neighbor. The extended element 18 of the terminals 12 protrude through the rectangular holes 25 in the floor surface 23 to communicate with incoming electrical conductors by the various known means of soldering, wrapping, crimping and the other like means. The length and configuration of the extended element 18 are determined by the method chosen for making the connection to the incoming conductors. The embossed portions 17 of the terminals 12 interfere with the sides of the holes 25 to secure the terminals 12 in the block 10 and to locate them in a predetermined position against appropriate reference surfaces. It is to be noted in FIGS. 3 and 4 that the precious metal contact portions 15 with their respective contactor members, extend beyond the separating projections 26 to effect electrical connection with an inserted printed circuit board.

Figure 7:
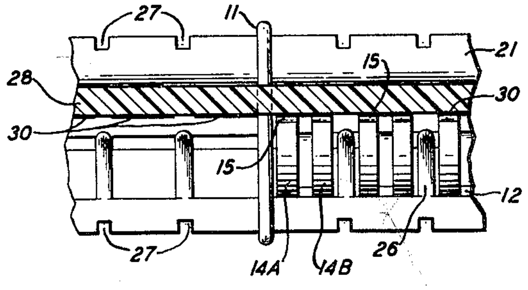
FIG. 7 is a face view of FIG. 2 showing the respective positions of the connector block, terminals and polarizing key when a printed circuit board is inserted in the connector.
Figure 9:
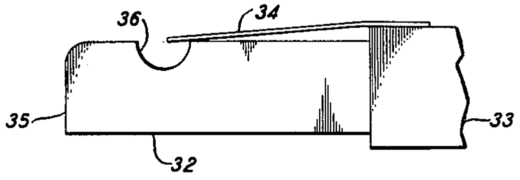
FIG. 9 is an elevation view of a tool for inserting the electrical terminal in an insulating block.

The operation of the connector can best be illustrated with reference to FIGS. 2, 6, 7 and 8. The printed circuit board 28 shown in FIG. 8 has a slot 29 located between two adjacent printed circuit leads 30. FIGS. 6 and 7 show a portion of a connector block 10 with electrical terminals 12 located in their appropriate position in one-half of the connector block. The terminal positions in the other half of the connector block have been left vacant to illustrate the structure of the connector block 10. As shown, the polarizing key 11 is located between the terminals 12 and does not block access to them. The dimensions of the terminals 12 and the printed circuit leads 30 are such that both contactor members 14A and 14B of a terminal 12 come in contact with a single printed circuit lead 30.

FIG. 7 shows a printed circuit board 28 inserted in a connector. The printed circuit leads 30 are indicated as heavy lines on the printed circuit board 28 which are adjacent the precious metal contact portions 15. It is evident that if dirt or some other foreign insulating substance was accidentally introduced between contactor member 14A and its associated printed circuit lead 30, that contactor member 14B of the same terminal 12 would provide an alternate electrical path to the same printed circuit lead 30. High reliability is thereby obtained by the dual contactor member structure. The special printed circuit board 28 with slot 29 is used when the polarizing key 11 is mounted on the block 10. As the printed circuit board 28 is inserted into the block 10 through the rectangular opening, the polarizing key 11 fits into the slot 29 allowing further insertion. It is evident that the board can be polarized in many different locations by simply slotting the printed circuit board in a different location. No matter where the polarizing key 11 is placed on the block 10, it does not interfere or block access to any of the terminals 12 because of its location between the terminals 12.

As mentioned previously, the pre-tensioning of the terminal 12 is accomplished during manufacturing and adjustment, if necessary, is done before the terminal 12 is inserted in the block 10. Insertion of the terminal 12 must be executed without altering or destroying the pre-tensioning of the contactor members 14A and 14B. FIGS. 9 through 12 show a tool for inserting a terminal 12 in an insulating block 10. The tool comprises a blade 32, a supporting shank 33 and a finger 34. The blade 32 has an end surface 35 and a notch 36.

Figure 10:
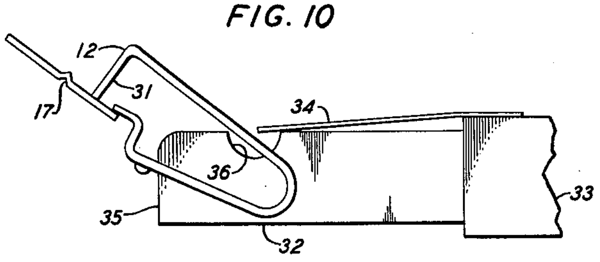
FIG. 10 is an elevation view of the tool shown in FIG. 9 illustrating the method in which a terminal is placed on the tool.
Figure 11:
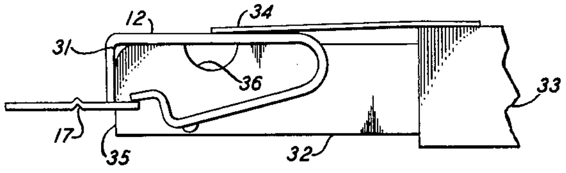
FIG. 11 is an elevation view of a tool and terminal ready for placement in a connector block.
Figure 12:
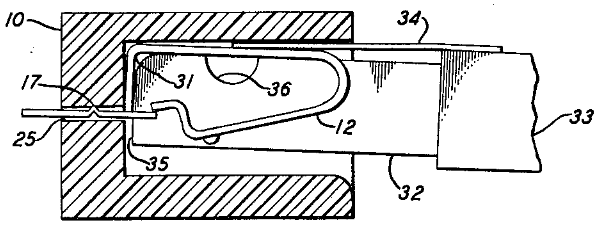
FIG. 12 is a section view demonstrating the tool inserting a terminal in a connector block.

The terminal 12, as shown in FIGS. 10 and 11, is mounted on the tool by slipping the end of the arm 13 under the finger 34. The blade 32 is thin enough to fit between the contactor members 14A and 14B so that the terminal 12 sits astride the blade 32. The finger 34 holds the terminal 12 on the blade 32 so that it can not fall off or change its position during the insertion process. When the terminal 12 is fully mounted on the blade 32, the push surface 31 of the terminal 12 is in contact with the end surface 35 of the blade 32. The terminal 12 is then inserted into the insulating block 10 by pushing with end surface 35 against the push surface 31. When the terminal 12 is fully inserted into the block 10 as shown in FIG. 12, the tool can be retracted without pulling the terminal out because the frictional force created between the embossed portion 17 of the terminal 12 with the surfaces 25 of the block 10 is greater than the force exerted by the finger 34, tending to hold the terminal 12 on the blade 32. Insertion of the terminal 12 is completed without altering the shape of it, which would change the amount of pre-tensioning.

The shank 33 of the tool is not disclosed in any specific embodiment because it is contemplated that the shank configuration will be determined by its use. If a hand tool is made, a single T handle is sufficient, while if multiple tools are made for automatic machinery, different shank shapes will be obvious to those skilled in manufacturing processes.

It is obvious that the invention is not limited to the specific structure illustrated and that it may be employed by those skilled in the art in ways too numerous to mention. Such use is within the scope of the appended claims.

What is claimed is:

1. A connector comprising a plurality of self pre-tensioned terminals included in an insulation block, the latter having front and rear surfaces joined by side walls and an elongated rectangular cavity in said front surface to receive a printed circuit board, said insulation block further having projections from the interior surfaces of said side wall in said cavity, said projections running in a direction perpendicular to said front and rear surfaces dividing said interior surfaces into terminal receiving openings, each of said openings including a terminal, said insulation block further including grooves on the exterior surfaces of said side walls, said grooves communicating with said front and rear surfaces and running parallel to and in line with said projections, at least one of said grooves including keying means, said means comprising a U-shaped element that fits over the outside front surface of said block and into said grooves, said element and said grooves located between adjacent terminals so that polarization of said block is accomplished without hindering access to any of said terminals.

2. A connector for receiving a printed circuit board comprising an insulation block and a plurality of electrical terminals, said block having front and rear surfaces joined by side walls, said front surface including a cavity to receive said board, said block further having parallel adjacent compartments in said cavity for mounting said terminals and parallel slots on the outer opposite surfaces of said walls, said slots extending in the direction of insertion of said board, and keying means, said means comprising arms which selectively seat in said slots, said means being formed to fit in between adjacent compartments so as to polarize said block without hindering access to any of said terminal compartments.

References Cited by the Examiner

UNITED STATES PATENTS

| | | | |
|---|---|---|---|
| 2,309,311 | 1/43 | Grohsgal | 339—97 |
| 2,539,230 | 1/51 | Craig | 339—258 X |
| 2,682,038 | 6/54 | Johnson | 339—258 X |
| 2,935,725 | 5/60 | Fox | 339—184 |
| 2,975,395 | 3/61 | Sitz | 339—252 |
| 2,983,896 | 5/61 | Gilbert | 339—184 |
| 3,032,741 | 5/62 | Fitz Gerald | 339—252 |
| 3,040,291 | 6/62 | Schweitzer et al. | 339—217 X |

FOREIGN PATENTS

| | | |
|---|---|---|
| 638,237 | 3/62 | Canada. |
| 1,219,360 | 12/59 | France. |
| 822,764 | 10/59 | Great Britain. |

JOSEPH D. SEERS, *Primary Examiner.*